United States Patent
Bähr et al.

(10) Patent No.: US 12,015,082 B2
(45) Date of Patent: Jun. 18, 2024

(54) DEPFET TRANSISTOR AND METHOD OF MANUFACTURING A DEPFET TRANSISTOR

(71) Applicant: Max-Planck-Gesellschaft zur Förderung der Wissenschaften e.V., Munich (DE)

(72) Inventors: Alexander Bähr, Gröbenzell (DE); Peter Lechner, Holzkirchen (DE); Jelena Ninkovic, Munich (DE); Rainer Richter, Munich (DE); Florian Schopper, Munich (DE); Johannes Treis, Munich (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 310 days.

(21) Appl. No.: 17/608,942

(22) PCT Filed: May 6, 2020

(86) PCT No.: PCT/EP2020/062504
§ 371 (c)(1),
(2) Date: Nov. 4, 2021

(87) PCT Pub. No.: WO2020/225275
PCT Pub. Date: Nov. 12, 2020

(65) Prior Publication Data
US 2022/0278233 A1 Sep. 1, 2022

(30) Foreign Application Priority Data
May 6, 2019 (DE) .......................... 10 2019 206 494

(51) Int. Cl.
*H01L 29/78* (2006.01)
*H01L 29/10* (2006.01)
(Continued)

(52) U.S. Cl.
CPC ........ *H01L 29/7838* (2013.01); *H01L 29/105* (2013.01); *H01L 29/42356* (2013.01);
(Continued)

(58) Field of Classification Search
CPC ............... H01L 29/7838; H01L 29/105; H01L 29/42356; H01L 29/66484;
(Continued)

(56) References Cited

U.S. PATENT DOCUMENTS 5,668,024 A  9/1997 Tsai et al.
2010/0133441 A1  6/2010 Aurola
(Continued)

FOREIGN PATENT DOCUMENTS

DE  102007017640 B3  9/2008

OTHER PUBLICATIONS

International Search Report and Written Opinion for PCT Application No. PCT/EP2020/062504, dated Aug. 20, 2020.
(Continued)

*Primary Examiner* — Shahed Ahmed
(74) *Attorney, Agent, or Firm* — Locke Lord LLP; Scott D. Wofsy; Christopher J. Capelli

(57) ABSTRACT

The invention relates to a DEPFET comprising: a semiconductor substrate (100) of a first conduction type, which has a first main surface (101) and a second main surface (102), which are opposite one another; a source terminal region (1s) of a second conduction type on the first main surface (101); a drain terminal region (1d) of a second conduction type; a channel region (10), which is arranged between the source terminal region (1s) and the drain terminal region (1d); a gate electrode (11), which is separated from the channel region (10) by a gate insulator (6); a rear activation region (104) of a second conduction type, which is formed on the second main surface (102); and a substrate doping
(Continued)

Figure 1:
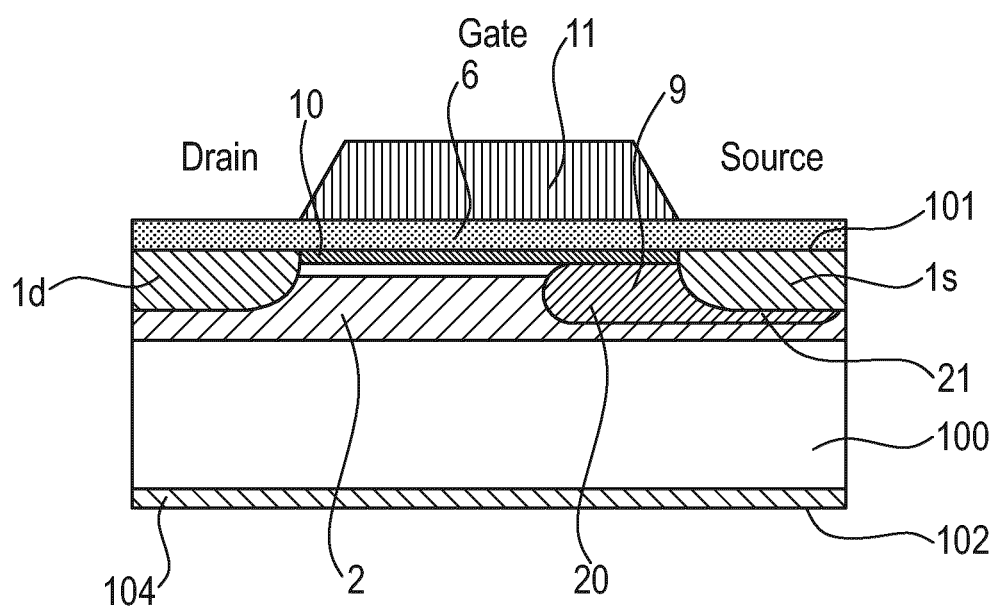

increase region (2) of a first conduction type, which is formed at least under the source terminal region (1s) and under the channel region (10), the substrate doping increase region (2) having a signal charge control region (20) of the first conduction type below the gate electrode (11), in which signal charge control region the effective doping dose has a higher value than at other points of the substrate doping increase region (2) below the gate electrode.

7 Claims, 4 Drawing Sheets

(51) Int. Cl.
    *H01L 29/423*     (2006.01)
    *H01L 29/66*     (2006.01)
    *H01L 31/113*     (2006.01)
    *H01L 21/265*     (2006.01)

(52) U.S. Cl.
CPC .. *H01L 29/66484* (2013.01); *H01L 29/66492* (2013.01); *H01L 29/7832* (2013.01); *H01L 29/7835* (2013.01); *H01L 31/1136* (2013.01); *H01L 21/26513* (2013.01); *H01L 21/26586* (2013.01)

(58) Field of Classification Search
CPC ........... H01L 29/66492; H01L 29/7832; H01L 29/7835; H01L 31/1136; H01L 21/26513; H01L 21/26586; H01L 31/115; H01L 21/8236; H01L 29/36–365; H01L 21/046–047; H01L 21/265–266; H01L 21/3115–31155; H01L 21/3215–32155
See application file for complete search history.

(56) References Cited

U.S. PATENT DOCUMENTS

| | | |
|---|---|---|
| 2010/0237392 A1 | 9/2010 | Strueder et al. |
| 2015/0333144 A1 | 11/2015 | Thompson et al. |
| 2016/0275225 A1* | 9/2016 | Dutta ................. G06F 30/36 |

OTHER PUBLICATIONS

J. Kemmer and G. Lutz: "New Detector Concepts" in Nuclear Instruments and Methods A253 (1987), p. 365.

Treberspurg, W., et al: "Measurement results of different options for spectroscopic X-ray DEPFET sensors", Journal of Instrumentation, vol. 13, No. 09, Sep. 17, 2018, pp. P09014-P09014, XP055721360, DOI: 10.1088/1748-0221/13/09/P09014.

Treberspurg, W., et al: "Studies of prototype DEPFET sensors for the Wide Field Imager of Athena", Proceedings of SPIE; [Proceedings of SPIE, ISSN 0277-786X vol. 10524], SPIE US, vol. 10397, Aug. 29, 2017, pp. 103970U-103970U, XP060093290, DOI: 10.1117/12.2274032, ISBN: 978-1-5106-1533-5.

* cited by examiner

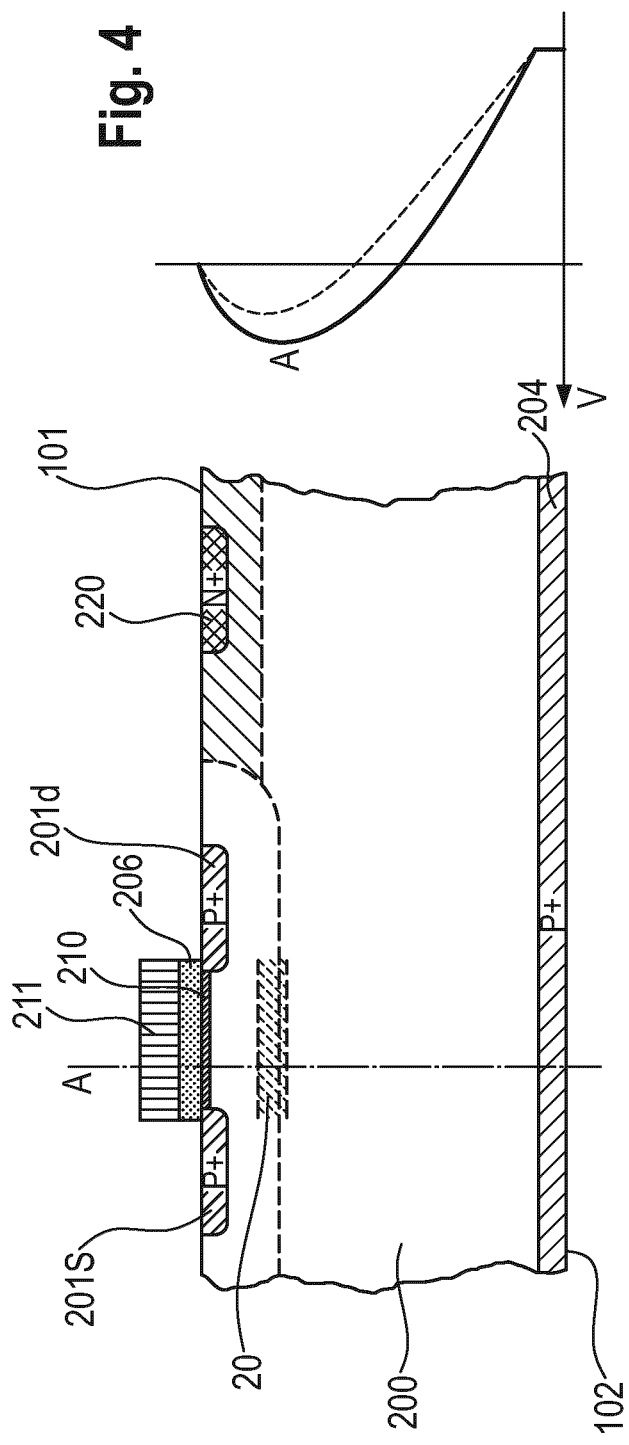

DEPFET TRANSISTOR AND METHOD OF MANUFACTURING A DEPFET TRANSISTOR

This application is the U.S. National Stage of PCT International Application No. PCT/EP2020/062504, filed May 6, 2020, which claims priority from Application No. DE102019206494.9, filed May 6, 2019. The entire disclosures of these applications are incorporated herein by reference in their entirety.

The invention is related to a DEPFET transistor and a method of manufacturing a DEPFET transistor.

DEPFET transistors were described already in the year 1987 in the article by J. Kemmer and G. Lutz: "New Detector Concepts" in Nuclear Instruments and Methods A253 (1987), page 365. Here, the name DEPFET is derived from DEPleted Field Effect Transistor, which designates a field effect transistor on a weakly doped semiconductor substrate that is completely depleted. In the following, the basic structure of such a detector will be explained based on FIG. 4 which has been taken from the above article.

As is shown in the left half of FIG. 4, a high-ohmic n silicon substrate 200 has a first (front side) main surface 101 and a second (back side) main surface 102. A highly doped p back side contact region 204 is located at the second (back side) main surface 102 of the semiconductor substrate 200. A highly doped p source connection region 201s and a highly doped p drain connection region 201d of an (enhancement-mode) MOSFET are arranged at the first (front side) main surface 101. The gate structure comprises a gate electrode 211 and a gate insulator 206. The semiconductor substrate located between the source connection region 201s and the drain connection region 201d below the gate insulator 206 forms the channel region 210 of the depletion-mode MOSFET that is shown.

When a reverse voltage is applied between the back side contact region 204 and the semiconductor substrate contact region 220 and the potentials of the source connection region 201s and the back side contact region 204 are appropriately adjusted, in the depleted semiconductor substrate a potential distribution can be generated such that a potential minimum for electrons exists below the transistor channel (see the right half of FIG. 4). When signal electrons that have been generated in the semiconductor by radiation accumulate in this potential minimum, they are able to control the current in the channel from there, which is the reason why the potential minimum is also designated as "internal gate" of the field effect transistor. In the left half of FIG. 4, such an "internal gate" is schematically shown and the reference number 20 is assigned to it.

The signal-to-noise ratio that can be achieved with a detector system is particularly affected by the input capacitance of the amplifier immediately connected to the detector, the so-called "front end" amplifier. Roughly speaking, the signal-to-noise ratio is the better the smaller the input capacitance. Here, due to its construction a DEPFET detector has large advantages as the capacitance of the internal gate is small and in particular stray capacitances do not exist which stray capacitances would be generated when the detector signal is transferred to an amplifier.

In the mentioned article, the following relationship is derived for the correlation between signal charge and the change of the drain current of the transistor:

$$dI_D = g_m \cdot Q / C_{eff} \quad (1)$$

wherein $dI_D$ is the change of the drain current generated by the signal (electron) charge Q, $g_m$ is the transconductance of the transistor and $C_{eff}$ designates the capacitance between the internal gate and the transistor channel.

As in a field effector transistor the transconductance $g_m$ is proportional to the ratio of gate width W to gate length L, it results from the above equation that particularly high signals can be achieved with short channel transistors. Based on this consideration, DEPFET detectors having a short gate length should make possible a particularly high signal-to-noise ratio. In particular, even the detection of single signal electrons should be possible thereby. However, the inventors have found by means of simulations that when the gate length of a DEPFET transistor is made shorter, not only the short channel effects known from conventional field effect transistors will occur but in addition further effects will occur that limit an increase of the signal-to-noise ratio.

Therefore, it is an object of the invention to provide a DEPFET transistor having a high signal-to-noise ratio, in particular a high amplification of signal charges.

The object is achieved by a DEPFET transistor according to claim 1 and claim 4 and a method of manufacturing a DEPFET transistor according to claim 10. Further developments of the invention are given in the dependent claims.

A DEPFET transistor according to the invention comprises:
a semiconductor substrate of a first conductivity type having a first main surface and a second main surface that are opposite to each other,
a field effect transistor portion formed at the first main surface which field effect transistor portion comprises a source connection region of a second conductivity type, a drain connection region of a second conductivity type, a channel region arranged between the source connection region and the drain connection region and a gate electrode above the channel region that is separated from the channel region by a gate insulator,
a back side control region of a second conductivity type formed at the second main surface and
a substrate doping enhancement region of a first conductivity type formed at the first main surface at least under the source connection region and under the channel region,
wherein the substrate doping enhancement region comprises a signal charge control region of the first conductivity type below the gate electrode, in which the effective doping dose has a higher value than at other positions of the substrate doping enhancement region below the gate electrode, so that the extension of the signal charge control region between the source connection region and the drain connection region is smaller than the extension of the gate electrode thereabove between the source connection region and the drain connection region.

The semiconductor substrate is for example a high-ohmic silicon substrate with a sheet resistance having a value equal to or larger than 1 kOhm-cm and preferably smaller than 15 kOhm-cm, meaning for example a value equal to or larger than 2 kOhm-cm and/or equal to or smaller than 5 kOhm-cm.

The substrate doping enhancement region is located close to the first main surface, however, is located thus far from the first main surface that its doping dose, which is at least two orders of magnitude lower than the one of the drain connection region and the source connection region, respectively, cannot be compensated by the doping dose of the drain connection region and the source connection region, respectively. The substrate doping enhancement region may preferably extend not only below the channel region and the source connection region but may be present also below a part or the whole of the drain connection region.

The drain connection region and source connection region, respectively, can comprise the complete drain region and source region, respectively, of the field effect transistor portion. In that case, the drain connection region and the source connection region are immediately adjacent to the gate electrode. However, in some embodiments the drain connection region and source connection region, respectively, may be only that region that serves for providing an ohmic contact to a metal contact for connecting the source or the drain. In the latter case, the drain connection region and the source connection region, respectively, would then be surrounded by a region of the same conductivity type, which, however, has a smaller doping dose than the drain connection region and the source connection region, respectively.

The effective doping dose in the signal charge control region, thus the number of dopants per unit area, preferably exceeds by approximately 50% or more the mean effective doping dose in the substrate doping enhancement region below the gate electrode. Apart from that, the advantageous effects described further below can also be achieved for lower percentages. However, as a rule the factor by which the effective doping dose is higher than the one of the substrate doping enhancement region should be 1.5 to 5, preferably 2 to 2.5. Here, the effective doping dose is mentioned because a part of the dopants can be compensated by dopants of the opposite conductivity type, thus e.g. in case the donor concentration predominates, a part of the donors may have been compensated by acceptors or vice versa.

If the DEPFET transistor is operated as sensor element for electromagnetic radiation or particle radiation, e.g. as pixel element of a DEPFET pixel detector having a matrix arrangement of DEPFETs, the signal charges induced by the radiation during operation will accumulate in the signal charge control region at least for some time. If the DEPFET transistor is used as amplifier for another detector, e.g. a semiconductor drift chamber, the signal charges from the other detector will be transferred into the signal charge control region, the "internal gate", of the DEPFET.

Preferably, the complete gate region and signal charge control region, respectively, has the described characteristics. However, advantageous effects of the invention can already be achieved if at least a gate portion, meaning a portion of the DEPFET has the described characteristics. Therefore, a field effector transistor portion is mentioned further above.

As between the source connection region and the drain connection region the extension of the signal charge control region is smaller than the extension of the gate electrode thereabove, the gate length of the "internal gate" is smaller than the gate length of the external gate (the extension of the gate electrode between the source connection region and the drain connection region). This implicates that the gate length of the internal gate can be chosen to be small for a high signal charge amplification and a high signal-to-noise ratio without having to accept disadvantageous short channel effects resulting from a concomitant shortening of the gate length of the external gate.

Finally, it shall be mentioned that in the field effect transistor portions there is preferably only one single gate electrode present in the direction of the gate length, thus between the source connection region and the drain connection region. Thus, there are not several MOS portions in the direction of the gate length, at which MOS portions different voltages can be applied.

Preferably, in an orthogonal projection onto the plane of the first main surface, the signal charge control region can be spaced apart from the drain connection region.

The signal charge control region is located below the channel region of the transistor and thus (with reference to the first main surface) is in a larger depth than the drain connection region. As it is the horizontal distance between the signal charge control region and the drain connection region which matters here, the best way to characterize this fact is projecting the signal charge control region and the drain connection region in an orthogonal projection onto the plane of the first main surface and referring to the distance in this plane.

The distance of the signal charge control region from the drain connection region provides for smaller field strengths in the border region between the signal charge control region and the drain connection region. When the gate length is reduced, this can lower the probability for the occurrence of avalanche generation in this area which has a disadvantageous effect on the signal-to-noise ratio.

Further preferably, in an orthogonal projection onto the plane of the first main surface, a resistance region in the form of a doping region of a second conductivity type may be formed between the drain connection region and the signal charge control region (20), wherein the doping dose of the doping region is smaller than the one of the drain connection region.

Due to the presence of the resistance region, the strength of the electric field at the drain-side end of the signal charge control region can be lowered. When the gate length is reduced, this can lower the probability for the occurrence of avalanche generation in this region that has a disadvantageous effect on the signal-to-noise ratio.

A further DEPFET transistor according to the invention comprises:
  a semiconductor substrate of a first conductivity type having a first main surface and a second main surface that are opposite to each other,
  a field effect transistor portion formed at the first main surface, which field effect transistor portion comprises a source connection region of a second conductivity type, a drain connection region of a second conductivity type, a channel region arranged between the source connection region and the drain connection region and a gate electrode above the channel region that is separated from the channel region by a gate insulator,
  a back side control region of a second conductivity type formed at the second main surface,
  a substrate doping enhancement region of a first conductivity type formed at the first main surface at least below the source connection region and below the channel region,
  wherein the substrate doping enhancement region comprises a signal charge control region of the first conductivity type below the gate electrode, in which the effective doping dose has a higher value than at other positions of the substrate doping enhancement region,
  wherein in an orthogonal projection onto the plane of the first main surface a resistance region in the form of a doping region of a second conductivity type is formed between the drain connection region and the signal charge control region, the doping dose of the doping region being smaller than the one of the drain connection region.

The semiconductor substrate is for example a high-ohmic silicon substrate with a sheet resistance having a value equal to or larger than 1 kOhm-cm and preferably smaller than 15 kOhm-cm, thus for example a value equal to or larger than 2 kOhm-cm and/or equal to or smaller than 5 kOhm-cm. The substrate doping enhancement region is located close to the first main surface, however, spaced apart from the first main surface by such an amount that its doping dose, which is by at least two orders of magnitude lower than the one of the drain connection region and source connection region, respectively, cannot be compensated by the doping dose of the drain connection region and source connection region, respectively. Preferably, the substrate doping enhancement region may extend not only below the channel region and the source connection region but also below a part or the whole of the drain connection region. The drain connection region and the source connection region, respectively, may comprise the whole drain region and source region, respectively, of the field effect transistor portion. In such case the drain connection region and source connection region, respectively, are immediately adjacent to the gate electrode. In some embodiments, the drain connection region and the source connection region, respectively, may however be only that region that serves for the manufacturing of an ohmic contact to a metal contact for connecting the source or the drain. In the latter case, the drain connection region and the source connection region, respectively, would be surrounded by a region of the same conductivity type which, however, has a smaller doping dose than the drain connection region and the source connection region, respectively.

If the DEPFET transistor is operated as sensor element for electromagnetic radiation or particle radiation, signal charges that are induced by the radiation during operation accumulate at least for some time in the signal charge control region. If the DEPFET transistor is used as amplifier for another detector, e.g. a semiconductor drift chamber, signal charges from the other detector are transferred to the signal charge control region, the "internal gate", of the DEPFET.

Preferably, the whole gate region and signal charge control region, respectively, has the described characteristics. However, advantageous effects of the invention can be achieved already when at least a gate portion, meaning a portion of the DEPFET, has the described characteristics, which is the reason why a field effect transistor portion is mentioned further above.

Here, the resistance region is a region formed by a separate doping which extends from the first main surface into the depth such that in operation of the DEPFET this region is in a series connection with the transistor channel above of the signal charge control region.

Due to the presence of the resistance region, the strength of the electric field at the drain-side end of the signal charge control region can be lowered. When the gate length is reduced, this can lower the probability for the occurrence of avalanche generation in this region which has a disadvantageous effect on the signal-to-noise ratio. Therefore, with such a design of a DEPFET, small channel lengths that are advantageous for a high signal charge amplification and a high signal-to-noise ratio can be obtained in a particularly advantageous way.

Preferably, in the further DEPFET transistor according to the invention, the signal charge control region (20) is located below the whole gate electrode (11). Due to the presence of the resistance region, the potential difference in the transistor channel above of the signal charge control region is smaller. Thereby, short channel effects can be attenuated even in a case in which the gate lengths of the external gate and of the "internal gate" are the same, which is the case when the signal charge control region is located below the whole gate electrode.

Further preferably, in the further DEPFET transistor according to the invention, the resistance region comprises a region of a second conductivity type having a smaller doping concentration than the one of the drain connection region (1d) which region in an orthogonal projection onto the plane of the first main surface (101) is arranged between the drain connection region (1d) and the gate electrode (11).

Here, the resistance region is arranged at least partially or completely outside of the region below the gate electrode. For an arrangement completely outside of the region below the gate electrode, the gate setup will be simpler so that particularly small channel lengths can be implemented more easily. As the doping dose of the resistance region is smaller than the one of the drain connection region, the field strength at the drain-side end of the signal charge control region is smaller so that the probability for avalanche generation does not become too high even for short channel lengths.

Further preferably, in the further DEPFET transistor according to the invention, the resistance region has a drain side channel region (15), which is a doping region of a second conductivity type at the drain-side end of the channel region (10) below the gate electrode (11), the doping dose of which is smaller than the one of the drain connection region (1d).

In this implementation of the DEPFET detector according to the invention, the resistance region is arranged at least partially or completely below the gate electrode. In operation, the drain side channel region does not act as transistor channel but as resistance connected in series to the transistor channel. For this, the doping dose is set such that there always exists a conductive resistance region independent of the potentials used for switching on and off the transistor. In other words, the gate voltage is not able to deplete the drain side channel region as a gate breakdown would occur before such condition is achieved. Furthermore, the drain side channel region is formed such that dopants of the drain side channel region do partially, however not completely, compensate the doping of the substrate doping enhancement region. Preferably, the doping dose for the drain border region is chosen such that it is equal to or larger than $1 \cdot 10^{12}/cm^2$ and/or equal to or smaller than $5 \cdot 10^{12}/cm^2$.

Alternatively or in addition to the drain side channel region, a source side channel region can be formed at the source-side end of the channel region below the gate electrode. Such source side channel region does in the same way compensate partially, however not completely, the doping of the substrate doping enhancement region. What was said for the drain side channel region applies to the doping parameters of the source side channel region.

Further preferably, in a DEPFET transistor according to the invention, there additionally exists a signal charge overflow region (21) below at least a part of the source connection region (1s).

The signal charge control region can be regarded as potential pocket that is not able to accommodate all signal charges when there is a large amount of signal charges. When, by a suitable choice of the doping doses of the signal charge control region and of the substrate doping enhancement region) such potential pocket is designed such that for large amounts of signal charges the excess signal charges are collected in a controlled way in the signal charge overflow region, a DEPFET can be realized that has a large dynamic range, in which DEPFET small amounts of signal charges are detected with high measurement sensitivity and nevertheless the measurement range is not exceeded even for large amounts of signal charges. For this, the signal charge overflow region is immediately adjacent to the signal charge control region.

Further preferably, in an orthogonal projection onto the plane of the first main surface, the extension of the gate electrode between the source connection region and the drain connection region is larger than 300 nm and/or smaller than 4.5 μm. The specified values for the gate length can be realized due to the inventive measures.

An inventive method of manufacturing a DEPFET transistor has the following steps:
providing a semiconductor substrate of a first conductivity type which has a first main surface and a second main surface opposite to each other,
forming a field effect transistor portion at the first main surface in that
dopants of a second conductivity type are introduced into the semiconductor substrate with a high doping dose in order to form a source connection region,
dopants of a second conductivity type are introduced into the semiconductor substrate with a high doping dose in order to form a drain connection region,
a gate insulator and a gate electrode arranged on the gate insulator are formed between the source connection region and the drain connection region on the first main surface,
forming a back side control region by introducing dopants of a second conductivity type at the second main surface with a high doping dose and
forming a substrate doping enhancement region of a first conductivity type at the first main surface at least under the source connection region and under the gate insulator,
forming a signal charge control region of the first conductivity type below the gate electrode, in which the effective doping dose has a higher value than at other positions of the substrate doping enhancement region below the gate electrode so that the extension of the signal charge control region between the source connection region and the drain connection region is smaller than the extension of the gate electrode there above between the source connection region and the drain connection region.

Preferably, in the method the signal charge control region is formed by additionally introducing dopants of a first conductivity type into the substrate doping enhancement region. By the additional introduction of dopants into the substrate doping enhancement region, a supplemental doping region having an increased doping dose is generated, whereby the position of the signal charge control region is defined. The additional introduction of dopants can be effected e.g. by means of an implantation with substantially the same energy as the one for the formation of the substrate doping enhancement region.

Further preferably, in the method a resistance region is formed by introducing dopants of a second conductivity type with a smaller doping dose than the one of the drain connection region, which resistance region in an orthogonal projection onto the plane of the first main surface is located between the drain connection region and the signal charge control region. Here, the doping dose is set such that a conductive resistance region always exists independent of the potentials at the gate for switching on and off the transistor. In particular, by the dopants the doping of the substrate doping enhancement region is partially, however not completely, compensated.

Still further preferably, in the method of forming the resistance region, dopants of a second conductivity type are introduced into the drain-side end of the channel region below the gate electrode, preferably by an implantation under an angle of more than 30° and/or less than 80° with respect to the perpendicular to the first main surface in order to form the resistance region.

By the oblique implantation, the manufacturing method can be made simpler. A preferred angle under which the dopants are implanted with respect to the perpendicular to the main surface is equal to or larger than 40° and/or equal to or smaller than 60°.

Further features and practicalities of the invention will arise from the description of embodiment based on the attached figures.

FIG. 1 schematically shows a sectional view of a portion of a DEPFET transistor of a first embodiment.

Figure 2:
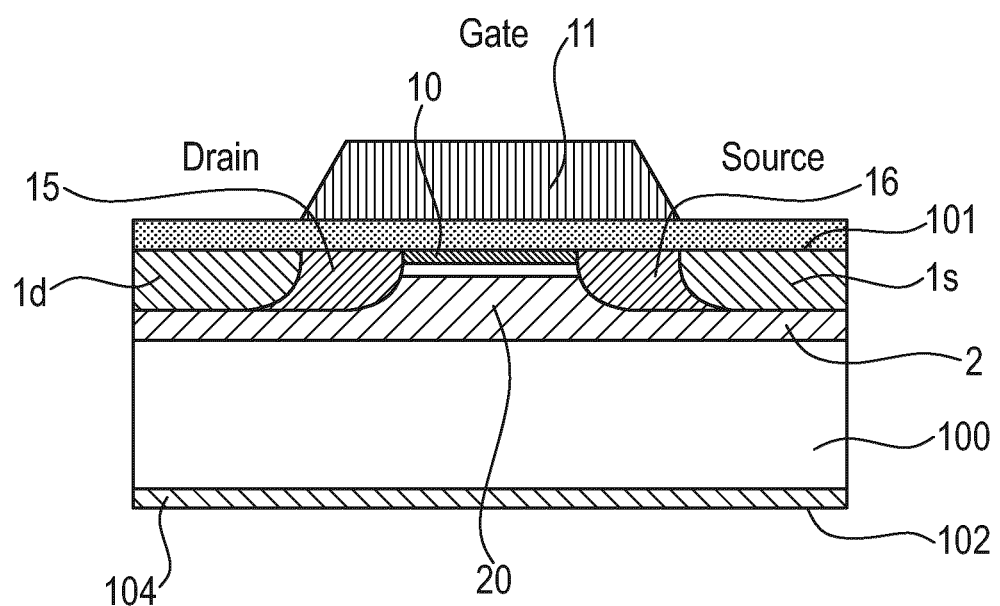

FIG. 2 schematically shows a sectional view of a portion of a DEPFET transistor of a second embodiment.

Figure 3:
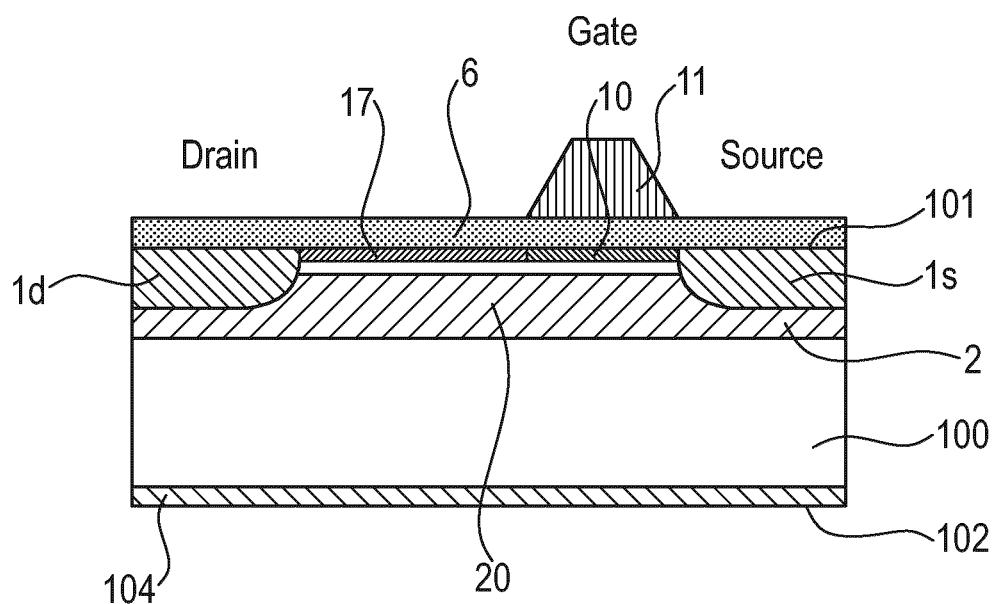

FIG. 3 schematically shows a sectional view of a portion of a DEPFET transistor of a third embodiment.

FIG. 4 schematically shows the structure of a known DEPFET transistor.

FIRST EMBODIMENT

FIG. 1 schematically shows a cut perpendicular to the main surfaces of a DEPFET transistor of a first embodiment. In the cut, a semiconductor substrate 100 (e.g. a high-ohmic n silicon substrate) having a first main surface 101 (chip front side and chip top side, respectively) is shown. A second main surface 102 (chip back side and chip bottom side, respectively) of the substrate 100 is opposite to the first main surface. In FIG. 1, a highly doped (in the example $p^+$-doped) source connection region 1s and a highly doped (in the example $p^+$-doped) drain connection region 1d can be seen. Both are adjoining a gate electrode 11 arranged between them, wherein a gate insulator 6 (for example an $SiO_2$ layer) is arranged between the gate electrode 11 and the semiconductor substrate 100. The semiconductor substrate between the source connection region 1s and the drain connection region 1d below of the gate insulator 6 forms the channel region 10 of the illustrated enhancement-mode MOSFET, wherein the doping of the semiconductor substrate may be changed in the channel region in order to adjust the threshold voltage $V_T$ of the MOSFET, e.g. by the implantation of acceptors.

Furthermore, a substrate doping enhancement region 2 below the transistor and close to the first main surface 101 can be seen in FIG. 1. The substrate doping enhancement region 2 may be present only below the source connection region 1s and below of a part of the channel region 10 adjacent to the same. However, preferably the substrate doping enhancement region 2 reaches below the drain connection region. Compared to the semiconductor substrate 100, this substrate doping enhancement region 2 has a higher n-doping. When the semiconductor substrate 100 is completely depleted by applying a high reverse voltage between a $p^+$-back side contact or rear side control region 104 at the second main surface 102 and a substrate connection contact (not shown), the presence of the substrate doping enhancement region 2 can prevent a punch-through between the source connection region 1s and the rear side contact 104. Here, it was assumed that the source connection region 1s does substantially have the potential of the substrate connection contact or is at least at a potential, which is negative with respect to the substrate connection contact and is considerably smaller (at least by a factor between 10 and 100) than the negative potential of the rear side contact 104. Furthermore, by the substrate doping enhancement region 2, a deepening of the potential minimum for the signal charges (in the example electrons) close to the first main surface 101 is achieved.

As can be seen in FIG. 1, below that part of the channel that is adjacent to the source connection region 1s and at a horizontal distance to the drain connection region 1d there is a supplemental doping region 9. This supplemental doping region 9 is formed by an additional local n-doping, wherein the doping dose is higher than the one of the substrate doping enhancement region 2. More precisely, with reference to the plane of the first semiconductor surface 101, the doping dose of the donors that are not compensated by acceptors, thus the effective doping dose, is higher in the supplemental doping region 9 than in the substrate doping enhancement region 2. This local enhancement of the effective doping dose has the effect that the potential minimum for signal charges (in the example electrons) adopts lower values in the supplemental doping region 9 than in the substrate doping enhancement region 2 when the semiconductor substrate 100 is depleted. As the doping dose of the supplemental doping region 9 is partially compensated by dopants of the source connection region 1s, the potential minimum lies below the channel region. Therefore, this region is designated as signal charge control region 20 and internal gate, respectively, as signal charges in this region are able to control the current in the channel region 10.

In FIG. 1, it can be seen that there is no signal charge control region 20 below the drain side portion of the channel region. As a result, the gate length of the internal gate, i.e. the horizontal dimension of the signal charge control region 20 in FIG. 1, is smaller than the horizontal dimension of the gate electrode 11, meaning the gate length of the external gate.

With the setup shown in FIG. 1, a high amplification can be achieved at a high signal-to-noise ratio. As results from equation (1), the change of the drain current that is generated by signal charges increases when the capacitance between the internal gate and the transistor channel decreases. As according to the present embodiment the supplemental doping region 9 is at a distance to the drain connection region 1d, also the signal charge control region 20 is at a distance to the drain connection region 1d and the dimension of the internal gate of the DEPFET, which corresponds to the signal charge control region 20, is reduced so that the capacitance between the internal gate and the transistor channel is reduced and as a result the amplification (drain current change) is increased.

Furthermore, by means of the first embodiment particularly channel lengths below 4.5 µm can be realized. As was already explained further above, the transconductance $g_m$ of the transistor scales with the inverse of the channel length L. Thus, there results a further possibility of achieving high amplifications (see equation (1)) in that the above setup is used for transistors having short channel lengths. The inventors assume that in conventional DEPFET transistors that are implemented with a short channel length L an increase of the signal-to-noise ratio is limited by the fact that due to the high field strengths in short channel transistors an avalanche generation occurs at the boundary between the drain connection region 1d and the semiconductor substrate (in particular the internal gate). However, as according to the first embodiment the supplemental doping region 9 is at a distance to the drain connection region 1d, the field strengths that occur in this setup will be not so high, which has a positive effect on the signal-to-noise ratio. By the introduction of additional donors into the supplemental doping region 9, the potential minimum for signal charges is deepened particularly at this position, so that the doping of the substrate doping enhancement region 2 can be lower in general as it is no longer the substrate doping enhancement region 2 alone that has to provide for a deepening of the potential minimum. A smaller doping of the substrate doping enhancement region 2 close to the drain connection region 1d on the other hand leads to lower field strengths at this position and thus to a reduced probability of avalanche generation.

It should still be mentioned that though in FIG. 1 the supplemental doping region 9 reaches under the source connection region 1c, the described advantages can be achieved in the same way when the supplemental doping region 9 is horizontally spaced apart also from the source connection region 1c.

Second Embodiment

FIG. 2 shows a second embodiment which differs from the first embodiment only in the following two aspects as can be seen in the figure: On the one hand, a distinct supplemental doping region 9 for forming the signal charge control region 20 has been omitted in the second embodiment. On the other hand, a drain side channel region 15 and a source side channel region 16 can be seen in FIG. 2. These two regions are p-doped regions at the drain-side end and the source-side end, respectively, of the channel below the gate insulator 6. The doping dose in these regions is smaller than the one in the source connection region 1c and the drain connection region 1d. Even if FIG. 2 shows a source side channel region 16, this can also be omitted. An advantageous behavior of the DEPFET transistor can also be achieved without such a source side channel region 16.

Due to the presence of the drain side channel region 15 and, as the case may be, the source side channel region 16 the doping dose in the substrate doping enhancement region 2 below is lowered. As a result, a signal charge control region 20 is formed which has a higher effective doping dose than the remaining substrate doping enhancement region 2 below the channel 10 (or the gate electrode 11) and which is horizontally spaced apart from the drain connection region 1d (and, as the case may be, from the source connection region 1c). It can be seen that as a result the same advantages can be achieved with the second embodiment as with the first embodiment. Only the manner of providing the signal charge control region 20, by a compensation of the doping of the substrate doping enhancement region 2 instead of a specific introduction of dopants, is different.

Third Embodiment

FIG. 3 shows a third embodiment that differs from the second embodiment in that neither a drain side channel region 15 nor a source side channel region 16 exists. However, the drain connection region 1d is horizontally spaced apart from the gate electrode 11 and a drain resistance region 17 is arranged at the first main surface 101 between the drain connection region 1d and the gate electrode 11. The drain resistance region 17 is a p-doped region having a doping dose that is smaller than the one of the drain connection region 1d.

Due to the presence of the drain resistance region 17, the doping dose in the substrate doping enhancement region 2 is partially compensated. As a result, that part of the substrate doping enhancement region 2 that has the highest effective doping dose (thus the signal charge control region 20) is horizontally spaced apart from the drain connection region 1*d*, even if it extends below the whole channel. Therefore, like in the first embodiment, the field strengths that will develop at the drain-side end of the signal charge control region 20 will be not so high, which has a positive effect on the signal-to-noise ratio. Accordingly, also this setup is suitable for transistors having short channel lengths and a small capacitance of the internal gate resulting therefrom. At the same time, the drain resistance region 17 has the effect that the voltage applied at the channel is smaller than the voltage between the drain connection region 1*d* and the source connection region 1*c*. Also this contributes to a limitation of the probability for avalanche generation at the drain-side end of the signal charge control region 20 even for small channel lengths L.

In the following, the steps for manufacturing a DEPFET transistor according to the invention will be outlined, wherein steps that are not explicitly mentioned are identical or analogous to the ones that are used in the manufacture of DEPFET transistors known in the prior art.

In order to form the back side control region 104, acceptors (e.g. boron) are introduced at a high dose at the second main surface 102 into the semiconductor substrate which usually is high-ohmic (e.g. 2 k/Ohm-cm). At the opposite first main surface 101, the source connection regions 1*s* and the drain connection regions 1*d* are formed by introducing acceptors (e.g. boron) with a high dose. In both cases the introduction is preferably by means of implantation (energy e.g. between 10 and 15 keV). The dose should be so high that the formation of an ohmic junction to the contacts (depending on the metallization that is used) is possible. As a rule, the dose for this lies between $10^{14}/cm^2$ and $10^{16}/cm^2$.

The substrate doping enhancement region 2 can for example be formed by implanting phosphorous with a high energy (e.g. approximately 0.5 to $2 \cdot 10^{12}/cm^2$ at approximately 300 to 600 keV). Here, the energy and the dose should be set such that the doping dose below the source connection region 1*s* and the drain connection region 1*d* is not completely compensated by dopants of the source connection region and the drain connection region.

The drain side channel region 15 or the source side channel region 16 can e.g. be introduced by an implantation of boron under an angle of more than 30° and/or less than 80°, preferably more than 40° and/or less than 60°, with respect to the perpendicular to the first main surface (101). Here, an energy of approximately 150 to 500 keV of the boron ions at a dose of approximately 1 to $5 \cdot 10^{12}/cm^2$ (depending on the doping depth and dose of the substrate doping enhancement region) can be chosen.

The supplemental doping region 9 can be formed like the substrate doping enhancement region 2, however with a dose that is higher than the one of the substrate doping enhancement region 2 by a factor of 1.5 to 5, preferably 2 to 2.5. An implantation under an angle with respect to the perpendicular to the first main surface (101) can also be chosen for forming the supplemental doping region 9, in particular when the supplemental doping region 9 is formed only under the gate electrode, however not under the source connection region.

The designs of the previously described embodiments with all respective possible variations can also be combined with each other. Thus, a DEPFET may for example comprise a supplemental doping region 9 and at the same time a drain side channel region 15. In the same way it is for example possible to provide a drain resistance region 17 for a DEPFET that has a drain side channel region 15 and/or a supplemental doping region 9.

Moreover, in all embodiments the n regions can be replaced by p regions and the p regions can be replaced by n regions. In other words, all embodiments can be implemented in the same way also on a p-type-conductive semiconductor substrate. Furthermore, the MOS field effect transistor portions may be of the enhancement-mode as well as of the depletion-mode.

The described DEPFET transistors can be used as detectors as such for particle radiation or electromagnetic radiation, in particular as pixels of a pixel detector. In particular, it is also conceivable to use a DEPFET transistor as amplifier for another detector, e.g. a semiconductor drift chamber.

In sensor operation for the detection of radiation-induced signal charges, the described DEPFET transistors are substantially operated such that for a complete depletion of the semiconductor substrate 100 a reverse voltage is applied between the back side control region 104 and a semiconductor substrate connection region and a suitable voltage is applied between the source connection region 1*s* and the drain connection region 1*d* and between the gate electrode 11 and the source connection region 1*s* in order to form a conductive channel. Signal charges that are present in the signal charge control region 20 can be removed by applying a (in the case of signal electrons positive) signal at the semiconductor substrate connection region for a short time.

The invention claimed is:

1. A DEPFET transistor comprising:
   a semiconductor substrate of a first conductivity type having a first main surface and a second main surface that are opposite to each other,
   a field effect transistor portion formed at the first main surface which field effect transistor portion comprises a source connection region of a second conductivity type, a drain connection region of a second conductivity type, a channel region arranged between the source connection region and the drain connection region and a gate electrode above the channel region that is separated from the channel region by a gate insulator,
   a back side control region of a second conductivity type formed at the second main surface and
   a substrate doping enhancement region of a first conductivity type formed at the first main surface at least under the source connection region and under the channel region,
   wherein the substrate doping enhancement region comprises a signal charge control region of the first conductivity type below the gate electrode, in which the effective doping dose has a higher value than at other positions of the substrate doping enhancement region below the gate electrode, so that the extension of the signal charge control region between the source connection region and the drain connection region is smaller than the extension of the gate electrode thereabove between the source connection region and the drain connection region.

2. The DEPFET transistor according to claim 1, wherein in an orthogonal projection onto the plane of the first main surface the signal charge control region is spaced apart from the drain connection region.

3. The DEPFET transistor according to claim 1, wherein in an orthogonal projection onto the plane of the first main surface a resistance region in the form of a doping region of a second conductivity type is formed between the drain connection region and the signal charge control region, the doping dose of which doping region is smaller than the one of the drain connection region.

4. The DEPFET transistor according to claim 3, wherein the resistance region comprises a region of a second conductivity type having a smaller doping concentration than the one of the drain connection region which region in an orthogonal projection onto the plane of the first main surface is arranged between the drain connection region and the gate electrode.

5. The DEPFET transistor according to claim 3, wherein the resistance region has a drain side channel region, which is a doping region of a second conductivity type at the drain-side end of the channel region below the gate electrode, the doping dose of which is smaller than the one of the drain connection region.

6. The DEPFET transistor according to claim 1, wherein there additionally exists a signal charge overflow region below at least a part of the source connection region.

7. The DEPFET transistor according to claim 1, wherein in an orthogonal projection onto the plane of the first main surface the extension of the gate electrode between the source connection region and the drain connection region is larger than 300 nm and/or smaller than 4.5 µm.

* * * * *